United States Patent
Onishi et al.

(10) Patent No.: US 7,436,874 B2
(45) Date of Patent: Oct. 14, 2008

(54) LASER DEVICE

(75) Inventors: Toshikazu Onishi, Kyoto (JP); Kazutoshi Onozawa, Osaka (JP); Shinji Yoshida, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 306 days.

(21) Appl. No.: 11/023,419

(22) Filed: Dec. 29, 2004

(65) Prior Publication Data
US 2005/0152430 A1 Jul. 14, 2005

(30) Foreign Application Priority Data
Jan. 14, 2004 (JP) ............................. 2004-007239

(51) Int. Cl.
*H01S 3/00* (2006.01)
*H01S 3/08* (2006.01)
(52) U.S. Cl. .................... 372/99; 372/103; 372/107; 372/38.05
(58) Field of Classification Search .............. 372/38.05
See application file for complete search history.

(56) References Cited

U.S. PATENT DOCUMENTS

| | | | |
|---|---|---|---|
| 5,617,445 A * | 4/1997 | Jewell | 372/96 |
| 6,040,936 A * | 3/2000 | Kim et al. | 359/245 |
| 6,785,320 B1 * | 8/2004 | Amos et al. | 372/102 |
| 6,834,027 B1 * | 12/2004 | Sakaguchi et al. | 369/13.32 |
| 6,998,649 B2 * | 2/2006 | Hata | 257/99 |
| 2003/0173501 A1 * | 9/2003 | Thio et al. | 250/216 |
| 2004/0091010 A1 * | 5/2004 | Choquette et al. | 372/44 |
| 2005/0070036 A1 * | 3/2005 | Geusic et al. | 438/29 |
| 2005/0269578 A1 * | 12/2005 | Barnes et al. | 257/81 |
| 2006/0245464 A1 * | 11/2006 | Hori et al. | 372/99 |

FOREIGN PATENT DOCUMENTS

JP 2003-188471 A 7/2003

* cited by examiner

*Primary Examiner*—Minsun Harvey
*Assistant Examiner*—Sean Hagan
(74) *Attorney, Agent, or Firm*—McDermott Will & Emery LLP

(57) ABSTRACT

According to the present invention, a first p-side electrode 7A made of metal which is provided with regularly arranged holes 10 having a diameter smaller than a laser oscillation wavelength and a second p-side electrode 7B arranged around the periphery of the first p-type electrode 7A are used as a p-side mirror of a surface-emitting laser. Light in a resonator formed of a p-side electrode 7 and an n-type mirror 2 is first converted to a surface plasmon and then reconverted to the light by the p-side electrode 7A, and then emitted outside the resonator.

13 Claims, 4 Drawing Sheets

LASER DEVICE

CROSS-REFERENCE TO RELATED APPLICATION

This non-provisional application claims priority under 35 U.S.C. § 119(a) on Patent Application No. 2004-007239 filed in Japan on Jan. 14, 2004, the entire contents of which are hereby incorporated by reference.

BACKGROUND OF THE INVENTION (a) Field of the Invention

The present invention relates to a laser device used as a light source for optical recording and optical communications. In particular, the invention relates to a surface-emitting semiconductor laser.

(b) Description of Related Art

In recent years, semiconductor lasers have been growing in demand as light sources for optical recording and optical communications. Among them, a surface-emitting semiconductor laser has been expected as a power-saving, low-cost light emitting element due to its features such as low threshold current, round beam spot, easiness in direct connection with an optical fiber and adaptability to inspection in a wafer state.

Hereinafter, referring to FIG. 7, an explanation is given to a configuration of a known surface-emitting semiconductor laser disclosed in Japanese Unexamined Patent Publication No. 2003-188471. FIG. 7 is a sectional view illustrating a configuration of a conventional surface-emitting semiconductor laser.

As shown in FIG. 7, the conventional surface-emitting semiconductor laser includes an n-type semiconductor substrate 101 made of GaAs, on which an n-type mirror 102 made of a 40.5-fold stack of laminated layers of $Al_{0.3}Ga_{0.7}As$ and $Al_{0.9}Ga_{0.1}As$, undoped spacer layers 103 made of $Al_{0.6}Ga_{0.4}As$, an active layer 104 made of a $Al_{0.11}Ga_{0.89}As/Al_{0.3}Ga_{0.7}As$ triple quantum well sandwiched between the spacer layers, a p-type AlAs layer 105, a p-type mirror 106 made of a 30.5-fold stack of $Al_{0.3}Ga_{0.7}As/Al_{0.9}Ga_{0.1}As$ laminated layers and a p-type GaAs layer 107 are stacked in this order. The n-type mirror 102 is doped with Si at a Nd concentration of $1\times10^{18}$ cm$^{-3}$ (donor concentration) and the p-type mirror 106 is doped with Zn at a Na concentration of $7\times10^{17}$ cm$^{-3}$ (acceptor concentration) Further, the p-type GaAs layer 107 is doped with Zn at a Na concentration of $1\times10^{19}$ cm$^{-3}$.

The p-type AlAs layer 105 includes oxidized regions 105A and a non-oxidized region 105B laterally sandwiched between the oxidized regions 105A, thereby narrowing current to the non-oxidized region 105B. An upper part of the n-type mirror 102 and the layers arranged thereon are shaped into a post structure 113. Further, a contact electrode 109 having an opening 112 for laser emission is formed on the p-type GaAs layer 107. An interlayer insulating film 110 made of SiNx is formed to cover the outer edges of the contact electrode 109, the side surfaces of the layers forming the post structure 113 and the exposed surface of the n-type mirror 102. Further, a wiring electrode 111 is formed on the interlayer insulating film 110. The wiring electrode 111 covers part of the interlayer insulating film 110 which is in contact with the outer edge of the contact electrode 109, thereby contacting the contact electrode 109. On the opposite surface of the semiconductor substrate 101, an n-side electrode 108 is formed.

When a bias voltage is applied between the n-side electrode 108 and the wiring electrode 111 in the thus configured surface-emitting semiconductor laser, current is narrowed to the non-oxidized region 105B of the p-type AlAs layer 105 to inject carriers into the active layer 104. As a result, light generated in the active layer 104 is oscillated in a resonator made up of the n-type mirror 102 and the p-type mirror 106 and then emitted out of the opening 112.

With the above-described conventional configuration, however, electrical conduction of holes is restricted by a spike in a valence band caused at an interface of a $Al_{0.3}Ga_{0.7}As/Al_{0.9}Ga_{0.1}As$ heterojunction in the p-type mirror 106, which causes inconvenience that extremely high voltage application is required for operating the surface-emitting laser. Further, since the p-type mirror 106 is shaped into the post structure and small in cross sectional area, the resistance component due to the influence of the spike becomes significantly large. This leads to a problem of heat generation in the p-type mirror 106. Since the cross sectional area of the p-type mirror 106 is small, the generated heat is not sufficiently emitted out, resulting in reduction in light emitting efficiency of the laser.

SUMMARY OF THE INVENTION

In view of the above problems, an object of the present invention is to provide a surface-emitting laser which is operated at low applied voltage and excellent in heat dissipation.

The laser device of the present invention is a laser device for emitting light comprising a first mirror and a second mirror which are opposed to each other to serve as a resonator, wherein the first mirror is provided with a plurality of holes having a maximum diameter not larger than the oscillation wavelength of the light.

According to this configuration, when light is incident on the first mirror, a surface plasmon resonance effect occurs to increase the intensity of light to be emitted from the first mirror. Thereby, light extraction efficiency improves significantly. Therefore, inherently low light transmittance materials can also be used as a material for the mirror.

If metal is used as the mirror material, heat generated is emitted outside with efficiency because the metal has very small thermal resistance. That is, heat dissipation improves.

The surface plasmon resonance effect mentioned herein is a phenomenon in which the light is first converted to a surface plasmon and then reconverted to the light by the first mirror to be emitted.

With the first mirror of the present invention, the intensity of light passing through the first mirror increases nonlinearly with respect to the intensity of light incident on the first mirror. Accordingly, laser light emitted from the inside of the resonator passes through the first mirror with a sufficient intensity, whereas light reflected from the outside, which is a cause of optical feedback noise, is less likely to reach the inside of the resonator due to its low intensity. Therefore, as compared with a conventional laser device using a mirror which increases the light intensity linearly, the optical feedback noise is dramatically suppressed. Thus, the present invention is effective if applied to uses such as reproduction of an optical disc, where the optical feedback noise caused by interference between lights reflected and emitted from an optical system or a disc has been a problem.

If the first mirror is metal and the holes are arranged in translational symmetry, the light is easily converted to the surface plasmon.

The laser device of the present invention may be a semiconductor laser device and the first mirror may serve also as an electrode on one side.

If the laser device is a semiconductor laser device and the first mirror is metal, a drop in voltage in the mirror is suppressed because the metal has extremely low electrical resistance, thereby reducing the quantity of heat generated in the resonator. Accordingly, the laser device is operated at low applied voltage.

The interval between the holes is preferably not larger than the oscillation wavelength.

It is preferable that the holes are assumed as first holes, second holes are further provided in the first mirror and an interval between the second holes is different from the interval between the first holes. In this case, the interval between the second holes is varied from the interval between the first holes. In so doing, the first holes cause the surface plasmon to extract light to the outside and the second holes control light emission in other oscillation modes than a certain oscillation mode. This allows a single mode oscillation. That is, a laser oscillation with a controlled lateral mode is obtained. Therefore, as compared with the conventional laser device, a light emitting region increases in area, thereby obtaining larger light output.

The holes may have an anisotropic planar shape. That is, when the holes are viewed in plan, the length in the longitudinal direction may be different from the length in the direction vertical to the longitudinal direction.

More specifically, the planar shape of the holes may be oval or rectangular. In such cases, the in-plane distribution of refractive indices becomes asymmetric. Accordingly, a difference in resonator gain is caused depending on the polarization direction, which facilitates polarization control.

The planar shape of the holes may be triangular. In this case, high light transmittance is obtained to light of 850 nm band wavelength.

The first mirror may have an anisotropic planar shape. That is, when the first mirror is viewed in plan, the length in the longitudinal direction may be different from the length in the direction vertical to the longitudinal direction.

More specifically, the planar shape of the first mirror may be oval or rectangular. In such cases, the in-plane distribution of refractive indices becomes asymmetric. Accordingly, a difference in resonator gain is caused depending on the polarization direction, which facilitates polarization control.

The first mirror is preferably made of any of Al, Ag and Au. In such cases, the light is easily converted to the surface plasmon.

According to the present invention, the surface plasmon resonance effect is caused by the holes provided in the mirror and the efficiency of light extraction from the mirror improves drastically. Therefore, inherently low light transmittance materials can also be used as a material for the mirror. Thus, a laser device can be obtained which is operated at low applied voltage and excellent in both heat dissipation and noise characteristic.

DETAILED DESCRIPTION OF THE INVENTION

First Embodiment

Figure 1:
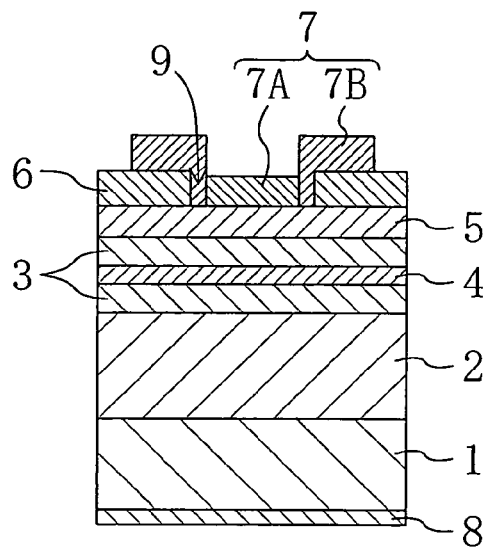
FIG. 1 is a sectional view illustrating a configuration of a surface-emitting semiconductor laser device according to a first embodiment of the present invention.

Hereinafter, an explanation is given to a first embodiment of the present invention with reference to the drawings. FIG. 1 is a sectional view illustrating a configuration of a surface-emitting semiconductor laser device according to the first embodiment of the present invention.

As shown in FIG. 1, the semiconductor laser device of the present embodiment includes an n-type semiconductor substrate 1 made of GaAs, on which an n-type mirror 2 made of a semiconductor layer in which $Al_{0.1}Ga_{0.9}As$ layers and $Al_{0.8}Ga_{0.2}As$ layers are alternately stacked, undoped spacer layers 3 made of $Al_{0.4}Ga_{0.6}As$, an active layer 4 including a GaAs quantum well layer (not shown) and a $Al_{0.2}Ga_{0.8}As$ barrier layer (not shown) which are vertically sandwiched between the undoped spacer layers 3 and a p-type GaAs layer 5 are stacked in this order.

In the active layer 4, the thickness of the GaAs quantum well layer and Al composition are adjusted so that a laser oscillation wavelength of 850 nm is obtained. The n-type mirror 2 is doped with Si at a donor concentration (Nd) of $1\times10^{18}$ cm$^{-3}$ and the p-type GaAs layer 5 is doped with C at an acceptor concentration (Na) of $3\times10^{18}$ cm$^{-3}$. An insulating film 6 having a circular opening 9 of 4 μm diameter is formed on the top surface of the p-type GaAs layer 5. A first p-side electrode 7A in a columnar shape made of Ag of 100 nm thickness is formed on a center part of the surface of the p-type GaAs layer 5 exposed in the opening 9 to have space from the insulating film 6. Further, a second p-side electrode 7B made of Ag is formed to bury the periphery portion of the opening 9, i.e., the space between the first p-side electrode 7A and the insulating film 6, and to cover part of the insulating film 6 closer to the opening 9. The first and second p-side electrodes 7A and 7B are referred to as a p-side electrode 7. If the first p-type electrode 7A and the second p-side electrode 7B are made of the same material and have the same layered structure, it is not always necessary to form these electrodes separately. The p-side electrodes 7A and 7B may be formed in one piece as the p-side electrode 7. On the opposite surface of the semiconductor substrate 1, an n-side electrode 8 is formed.

Figure 2:
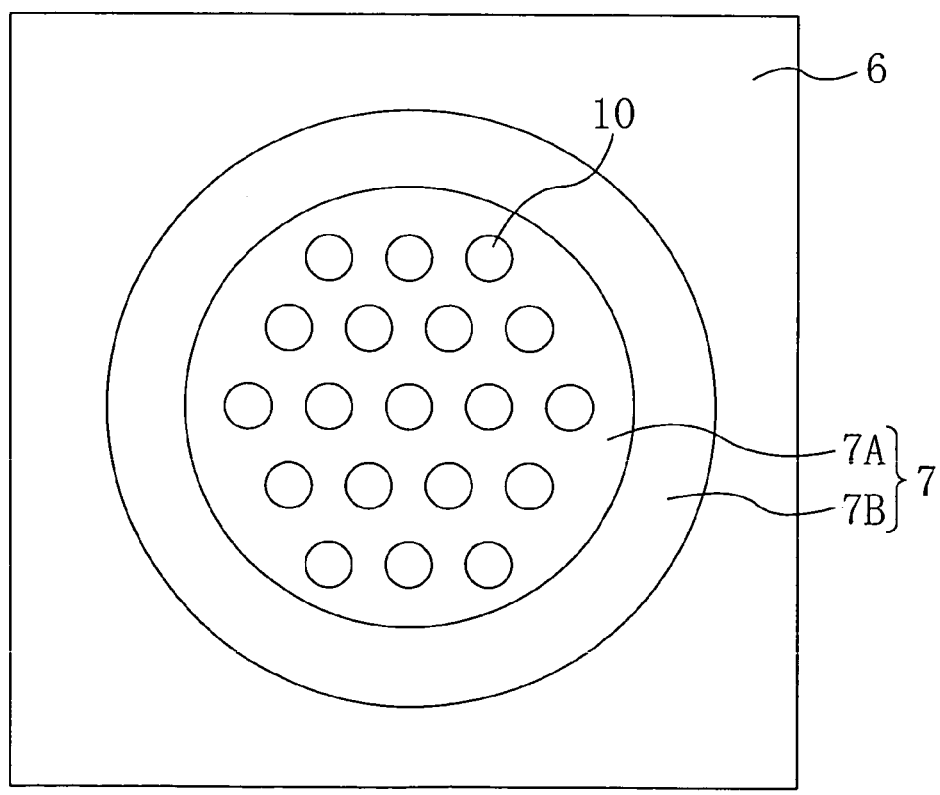
FIG. 2 is a plan view illustrating a configuration of the surface-emitting semiconductor laser device according to the first embodiment of the present invention.

FIG. 2 is a plan view illustrating a configuration of the surface-emitting semiconductor laser device according to the first embodiment. As shown in FIG. 2, in the first electrode 7A of the p-side electrode 7, circular holes 10 of 425 nm diameter penetrating through the first electrode 7A are arranged at regular intervals of 800 nm. The holes 10 are formed by selectively etching Ag by a method such as electron beam lithography and ion milling. The holes 10 are not formed in the ring-shaped second p-side electrode 7B arranged around the periphery of the first p-side electrode 7A.

Hereinbelow, again with reference to FIG. 1, an explanation is given to the operation of the surface-emitting semiconductor laser device of the present embodiment. When a bias voltage is applied to the n-side electrode 8 and the p-side electrode 7, current is injected into the active layer 4 through part of the second p-side electrode 7B buried in the opening 9 and the p-type GaAs layer 5 to cause charge recombination in the active layer 4. As a result, light generated in the active layer 4 is oscillated in a resonator made up of the n-type mirror 2 and the p-side electrode 7 to give a laser oscillation of 850 nm wavelength.

Since the first p-side electrode 7A is provided with the holes 10 arranged at regular intervals, light reached the p-side electrode 7 from the inside of the resonator is easily converted to the surface plasmon. The excited surface plasmon is reconverted to light to be emitted out of the resonator. As a result, light transmission which is several orders of magnitude larger than the transmittance determined by the hole area is given, thereby permitting laser light emission from the first p-side electrode 7A. In this case, especially where the center-to-center distance between adjacent holes 10 is smaller than the laser oscillation wavelength and the diameter of the holes 10 is about half the distance, energy conversion between the light and the surface plasmon is carried out with efficiency. Thus, the light transmittance improves.

So far, semiconductor multilayer films have been used as the p-side mirror of the conventional laser device. Therefore, a spike occurs in a valence band, requiring high voltage application to operate the surface-emitting laser. According to the present embodiment, however, the spike does not occur because the p-side electrode 7 is made of metal and therefore the applied voltage required for operating the surface-emitting laser is reduced.

Further, since the holes 10 are provided in the first p-side electrode 7A, light absorption by the first p-side electrode 7A is less prone to occur, thereby improving the light transmittance. Accordingly, even if the p-side electrode 7 is made of metal which has not been used because of its low light transmittance, the laser light is emitted out of the resonator with efficiency. Moreover, since the metal has high thermal conductivity, heat generated in the vicinity of the p-side electrode 7 as the laser device is operated is efficiently released to a heat sink (not shown) connected to the p-side electrode 7.

Figure 3:
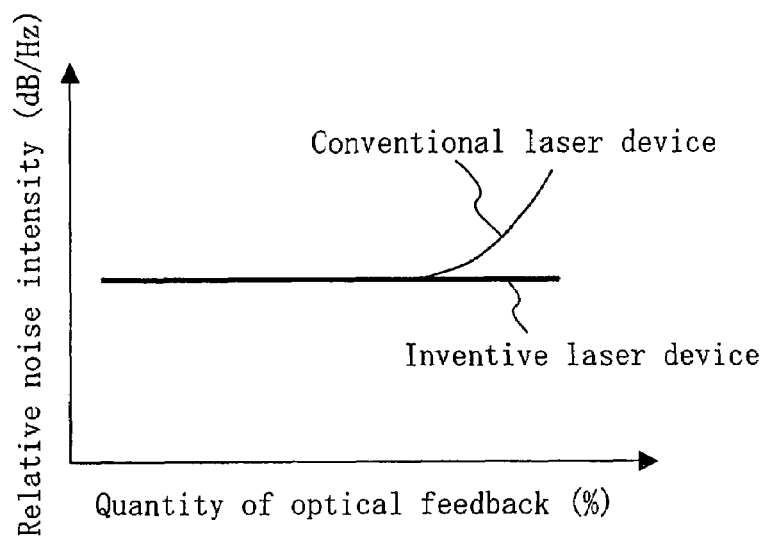
FIG. 3 is a graph illustrating a dependence of relative noise intensity on the quantity of optical feedback in a laser device of the first embodiment and a conventional laser device.

Then, referring to FIG. 3, an explanation is given to a noise characteristic of the surface-emitting laser device of the present embodiment. FIG. 3 is a graph illustrating a dependence of relative noise intensity on the quantity of optical feedback in the laser device of the present embodiment and a conventional laser device. As shown in FIG. 3, the conventional laser device shows an increase in relative noise intensity as the quantity of optical feedback increases. However, the laser device of the present embodiment keeps the noise characteristic low without increasing the relative noise intensity even if the quantity of optical feedback increases. This is derived from that the transmittance of the first p-side electrode 7A increases nonlinearly due to the occurrence of the surface plasmon. That is, the emitted laser light has enough intensity to pass through the first p-side electrode 7A, whereas the light reflected from outside, which is a cause of the optical feedback noise, is low in intensity and less likely to enter the resonator. Therefore, the noise characteristic is kept low. Thus, the present embodiment is effective if applied to uses such as reproduction of an optical disc.

Second Embodiment

Figure 4:
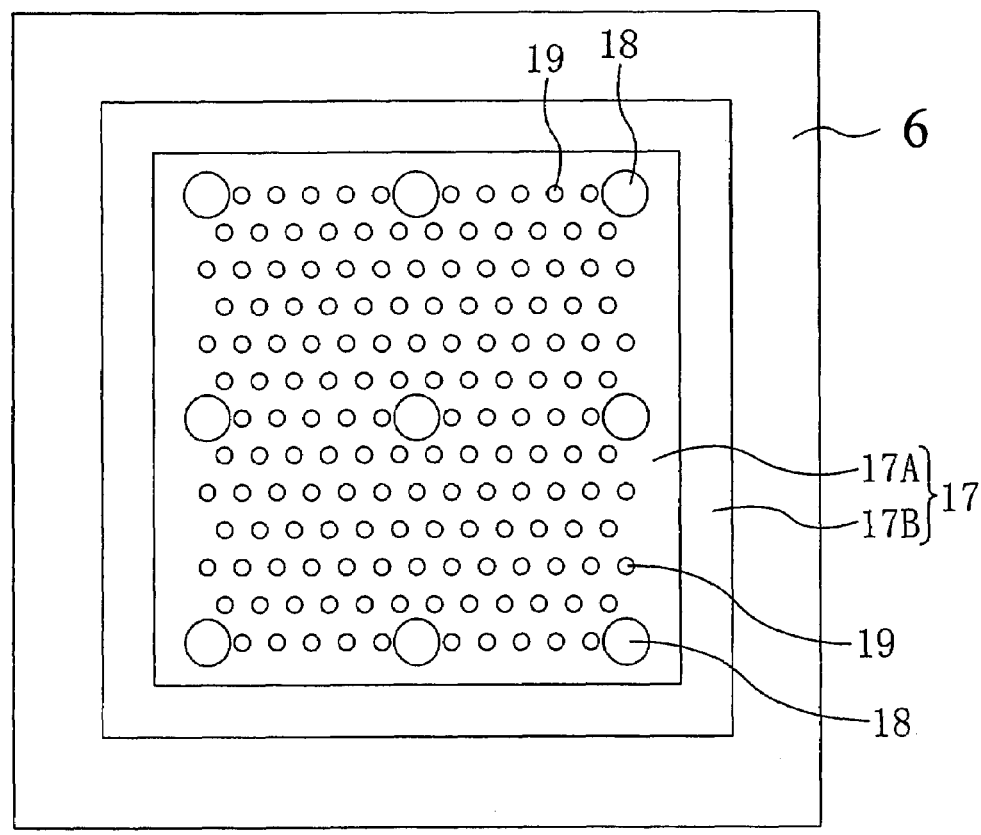
FIG. 4 is a plan view illustrating a configuration of a surface-emitting semiconductor laser device according to a second embodiment of the present invention.

Hereinafter, a second embodiment of the present invention is explained with reference to the drawings. FIG. 4 is a plan view illustrating a configuration of a surface-emitting semiconductor laser device according to the second embodiment of the present invention. Since the cross sectional configuration of the surface-emitting semiconductor laser device of the present embodiment is the same as that of the first embodiment, explanation and representation thereof are omitted and only a planar configuration different from the first embodiment is explained below.

As shown in FIG. 4, in the surface-emitting semiconductor laser device of the present embodiment, a p-side electrode 17 includes a first p-side electrode 17A of 12 μm square and a second p-side electrode 17B arranged around the periphery of the first p-side electrode 17A. Though not shown, the first and second p-side electrodes 17A and 17B are formed on the p-type GaAs layer 5 (shown in FIG. 1).

The first p-side electrode 17A is provided with first holes 19 arranged at first regular intervals and second holes 18 arranged at second regular intervals. The first holes 19 are 300 nm in diameter and arranged at intervals of 800 nm. The second holes 18 are 400 nm in diameter and arranged at intervals of 4.8 μm.

In the p-side electrode 17, the first holes 19 generate the surface plasmon from the light in the same manner as the holes 10 of the first embodiment, thereby extracting the light in the resonator to the outside. The second holes 18 functions as a boundary for dividing the p-side electrode 17 into several regions, whereby the light emission in other oscillation modes than a certain oscillation mode is controlled. Thus, a single lateral-mode oscillation is allowed.

In the present embodiment, the existence of the second holes 18 allows obtaining a laser oscillation with a controlled lateral mode. Accordingly, the light emitting region (the first p-side electrode 17A in the present embodiment) increases in area, thereby obtaining larger light output.

The first p-side electrode 17A in the present embodiment is square-shaped. Even if it is rectangular or circular, the same effect is obtained.

Third Embodiment

Figure 5:
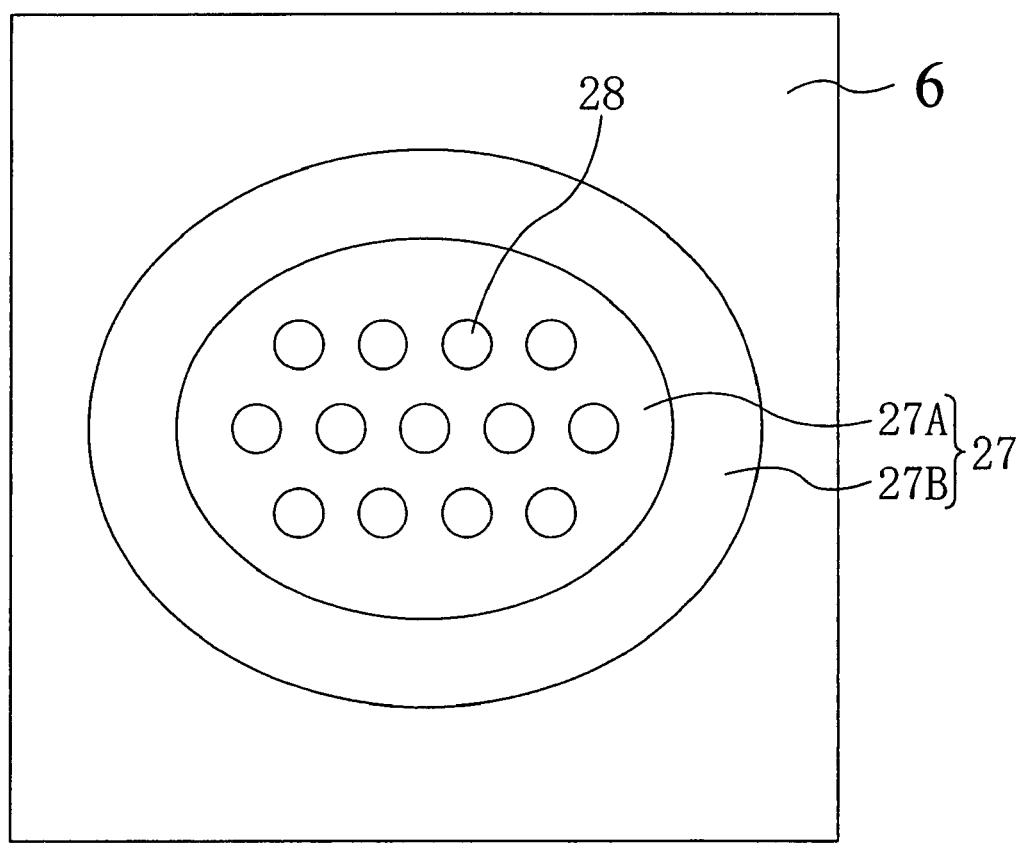
FIG. 5 is a plan view illustrating a configuration of a surface-emitting semiconductor laser device according to a third embodiment of the present invention.

Hereinafter, an explanation is given to a third embodiment of the present invention with reference to the drawings. FIG. 5 is a plan view illustrating a configuration of a surface-emitting semiconductor laser device according to the third embodiment of the present invention. Since the cross sectional configuration of the surface-emitting semiconductor laser device of the present embodiment is the same as that of the first embodiment, explanation and representation thereof are omitted and only a planar configuration different from the first embodiment is explained below.

As shown in FIG. 5, in the surface-emitting semiconductor laser device of the present embodiment, a p-side electrode 27 includes a first p-side electrode 27A with a 4 μm major axis and a 3 μm minor axis and a second p-side electrode 27B arranged around the periphery of the first p-side electrode 27A. Though not shown, the first and second p-side electrodes 27A and 27B are formed on the p-type GaAs layer 5 (shown in FIG. 1) in the same manner as the first embodiment. Further, the first p-side electrode 27A is provided with holes 28 arranged at regular intervals in the same manner as in the first embodiment.

In the present embodiment, the first p-side electrode 27A, in which the holes 28 are formed, is in the oval form and has anisotropy between the major axis direction and the minor axis direction. Accordingly, the in-plane distribution of refractive indices becomes asymmetric. This causes a difference in resonator gain depending on the polarization direction, thereby facilitating polarization control.

In the present embodiment, the p-side electrode 27 having the oval planar shape is explained. However, the planar shape of the p-side electrode 27 may be rectangular. In this case, the same effect is obtained because a rectangle is also anisotropic.

Further, in the present embodiment, the first p-side electrode 27A in which the holes 28 are formed is shaped to have an anisotropic planar shape to allow the polarization control. However, as an alternative manner, the holes 28 may have an anisotropic planar shape. More specifically, the shape of the holes 28 may be oval or rectangular. Also in this case, the resonator gain varies depending on the polarization direction, thereby facilitating the polarization control.

Other Embodiments

The description in the first to third embodiments is directed to the surface-emitting semiconductor laser device, but the present invention is not limited to this application. For example, the present invention is applicable to other lasers such as Fabry-Perot semiconductor lasers, solid state lasers and gas lasers. In any case, the same effect is obtained.

In the first to third embodiments, the value of the interval between the holes is specified, but the interval between the holes according to the present invention is not limited thereto.

In the first to third embodiments, the value of the diameter of the holes is specified. However, the diameter of the holes according to the present invention is not limited thereto as long as it is not larger than the laser oscillation wavelength.

In the first to third embodiments, the shape of the holes is circular, oval or rectangular. However, the shape of the holes of the present invention is not limited thereto and the holes may be polygonal such as triangular. In general, the selectivity to wavelength varies depending on the hole shape. Therefore, an optimum hole shape is selected depending on the laser oscillation wavelength. As the hole shape has fewer vertexes, the transmittance at long wavelengths tends to be higher. For example, if the hole shape is triangular, high transmittance to light of 850 nm wavelength is obtained.

In the first to third embodiments, the p-side electrode is made of Ag. However, the material for the p-side electrode of the present invention is not limited thereto and other materials, for example, Al, Au, Ni and Cr, may be used.

In the first to third embodiments, the semiconductor layer is made of AlGaAs. However, the material for the semiconductor layer of the present invention is not limited thereto and InP materials and GaN materials may be used, for example.

Figure 6:
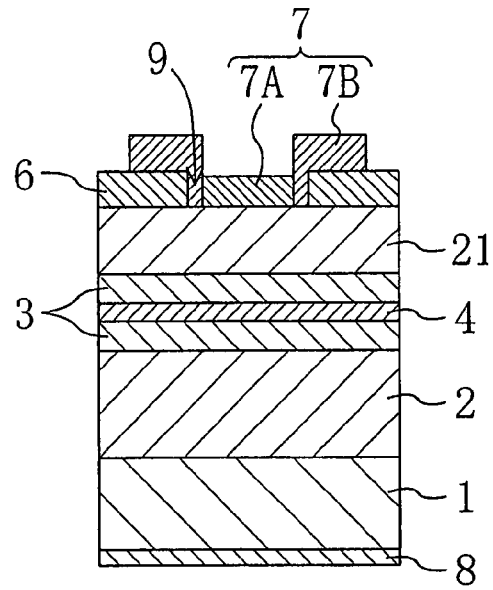
FIG. 6 is a sectional view illustrating a configuration of a surface-emitting semiconductor laser device of the present invention including a p-side electrode and a p-type semiconductor multilayer film 21 serving as a p-type mirror.
Figure 7:
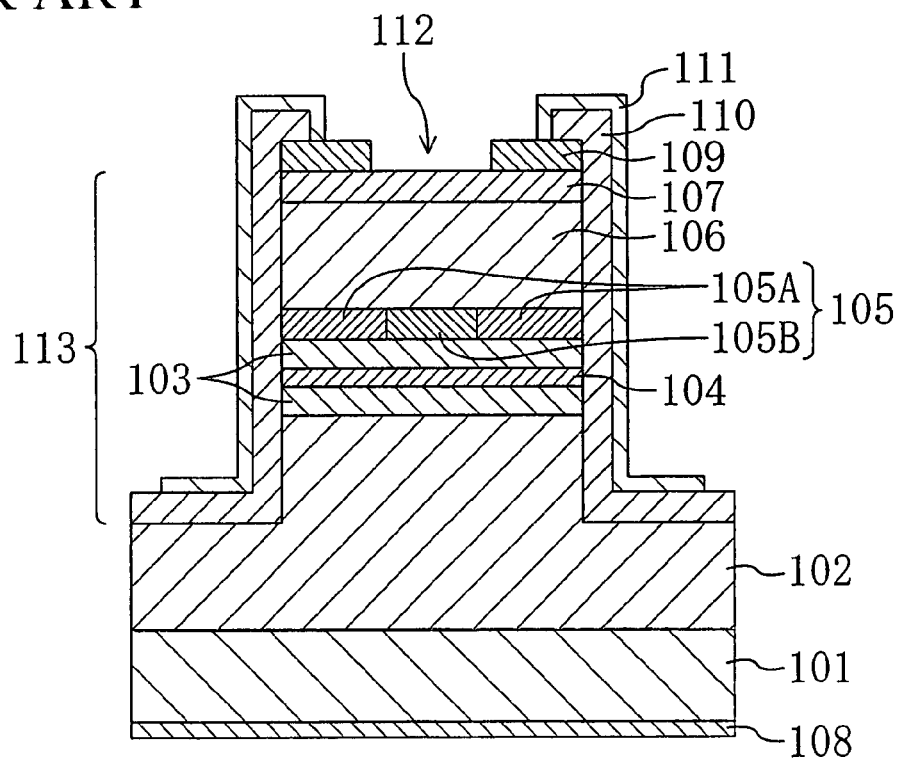
FIG. 7 is a sectional view illustrating a configuration of a conventional surface-emitting semiconductor laser device.

In the first to third embodiments, the p-side mirror is constituted solely of the p-side electrode. However, the present invention may be applied to semiconductor laser devices as shown in FIG. 6, for example, in which the p-side electrode 7 and the p-type semiconductor multilayer film 21 serve as the p-side mirror. FIG. 6 is a sectional view illustrating a configuration of a surface-emitting semiconductor laser device of the present invention including the p-side electrode and the p-type semiconductor multilayer film serving as the p-side mirror. The p-type semiconductor multilayer film 21 shown in FIG. 6 is made of, for example, alternately stacked $Al_{0.1}Ga_{0.9}As$ layers and $Al_{0.8}Ga_{0.2}As$ layers.

What is claimed is:

1. A laser device for emitting light, comprising:
a first mirror and a second mirror which are opposed to each other to serve as a resonator,
wherein the first mirror has a metal layer,
the first mirror is provided with a plurality of first and second holes having a maximum diameter not larger than the oscillation wavelength of the light and penetrating through the metal layer,
the first holes are arranged at first regular intervals,
the second holes are arranged in the same area in which the first holes are provided, at second regular intervals, and
the first and second regular intervals differ from each other.

2. A laser device according to claim 1, wherein the light is first converted to a surface plasmon and then reconverted to the light by the first mirror, and then the light is emitted.

3. A laser device according to claim 1, wherein the intensity of light passing through the first mirror increases nonlinearly with respect to the intensity of light incident on the first mirror.

4. A laser device according to claim 1, wherein the first mirror is metal and the holes are arranged in translational symmetry.

5. A laser device according to claim 1, wherein the laser device is a semiconductor laser device and the first mirror serves also as an electrode on one side.

6. A laser device according to claim 1, wherein the interval between the holes is not larger than the oscillation wavelength.

7. A laser device according to claim 1, wherein the holes are assumed as first holes, second holes are further provided in the first mirror, and the interval between the second holes is different from the interval between the first holes.

8. A laser device according to claim 1, wherein the holes have an anisotropic planar shape.

9. A laser device according to claim 8, wherein the planar shape of the holes is oval or rectangular.

10. A laser device according to claim 1, wherein the planar shape of the holes is triangular.

11. A laser device according to claim 1, wherein the first mirror has an anisotropic planar shape.

12. A laser device according to claim 11, wherein the planar shape of the first mirror is oval or rectangular.

13. A laser device according to claim 1, wherein the first mirror comprises any of Al, Ag and Au.

* * * * *